US006324746B1

(12) United States Patent
Bruzek et al.

(10) Patent No.: US 6,324,746 B1
(45) Date of Patent: Dec. 4, 2001

(54) METHOD OF MANUFACTURING A STABLE MULTIFILAMENT SUPERCONDUCTOR WITH REDUCED LOSSES

(75) Inventors: Christian Bruzek, Belfort; Philippe Mocaer, Hericourt, both of (FR)

(73) Assignee: Gec Alsthom Electromecanique S.A., Paris (FR)

( * ) Notice: Subject to any disclaimer, the term of this patent is extended or adjusted under 35 U.S.C. 154(b) by 0 days.

(21) Appl. No.: 09/189,972

(22) Filed: Nov. 12, 1998

(30) Foreign Application Priority Data

Nov. 13, 1997 (FR) .................................................. 97 14222

(51) Int. Cl.[7] .................................................. H01L 39/24
(52) U.S. Cl. .......................... 29/599; 174/125.1; 505/100
(58) Field of Search ........................ 29/599; 174/125.1; 505/100

(56) References Cited

U.S. PATENT DOCUMENTS

| 3,958,327 | * | 5/1976 | Marancik et al. . | |
| 4,411,712 | * | 10/1983 | Marancik . | |
| 4,652,697 | * | 3/1987 | Ando et al. . | |
| 4,665,611 | * | 5/1987 | Sadakata et al. . | |
| 4,723,355 | | 2/1988 | Both et al. . | |
| 4,973,365 | * | 11/1990 | Ozeryansky et al. | 29/599 |
| 5,088,183 | * | 2/1992 | Kanithi | 29/599 |
| 5,369,873 | * | 12/1994 | Walters et al. | 29/599 |
| 5,419,974 | * | 5/1995 | Walters et al. | 29/599 |
| 5,926,942 | * | 7/1999 | Kubo et al. | 29/599 |

FOREIGN PATENT DOCUMENTS 0 156 626 A1   10/1985   (EP) .

* cited by examiner

*Primary Examiner*—Carl J. Arbes
(74) *Attorney, Agent, or Firm*—Sughrue, Mion, PLLC

(57) ABSTRACT

A method of manufacturing a stable multifilament multiconductor with reduced losses includes making a billet by the single stacking technique. Conductive matrix rods and/or resistive matrix rods are disposed in the superconductor filament of the billet to form matrix channels between bundles of superconductor filaments. The rods preferably have a polygonal section, preferably square or rectangular, more preferably hexagonal.

19 Claims, 3 Drawing Sheets

METHOD OF MANUFACTURING A STABLE MULTIFILAMENT SUPERCONDUCTOR WITH REDUCED LOSSES

BACKGROUND OF THE INVENTION

1. Field of the Invention

The invention concerns the manufacture of a superconductor consisting of a large number of filaments.

To be more precise it consists in a method of manufacturing a stable multifilament superconductor with reduced losses, which method is faster and more economic than prior art methods.

2. Description of the Prior Art

Two problems must be solved in manufacturing a superconductor, namely improving the stability of the superconductor and reducing losses.

Depending on the intended uses, the emphasis is given to one or other of these requirements by varying the composition of the matrix.

Figure 1:
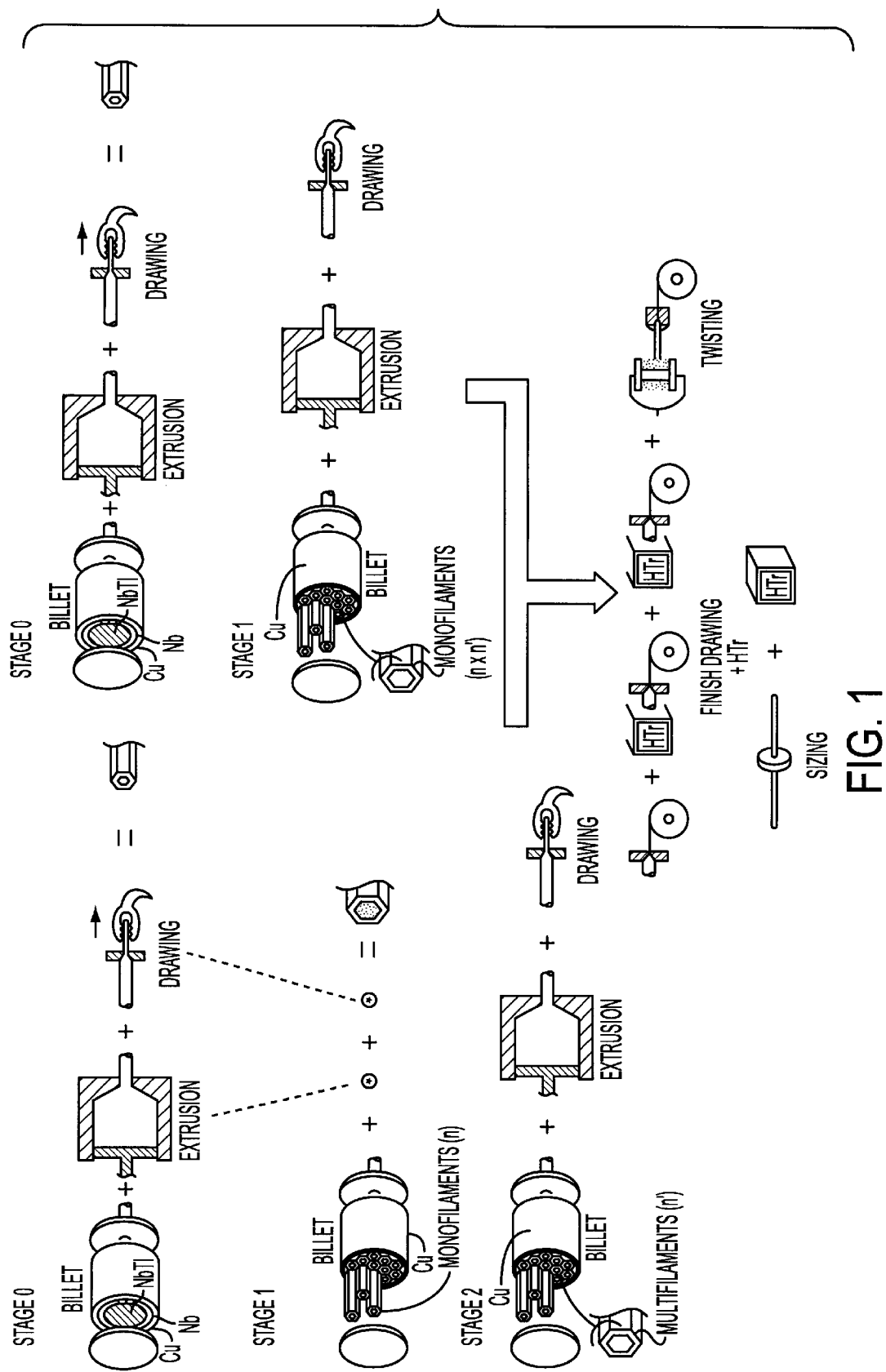

There are at present two techniques for manufacturing a multifilament superconductor and each has its own advantages and disadvantages. The two techniques are described briefly hereinafter with reference to FIG. 1 of the accompanying drawings.

The double stacking technique necessitates three steps:

stage 0: manufacture of monofilament rods by extruding and drawing billets containing a superconductor alloy in a matrix (in the example shown, NbTi alloy, Cu matrix);

stage 1: assembling a large number of monofilament rods (generally less that 1000) in a matrix tube (Cu in this example);

stage 2: assembling a large number of multifilament rods (generally less than 1000) in a matrix tube (Cu in this example).

The superconductor is then subjected to the usual finish drawing, heat treatment, twisting and sizing processes.

The above technique provides superconductors with matrix channels within the filament area. These channels are the matrix tube in which the monofilament rods are assembled in stage 1. The presence of the channels increases the heat stability of the wire and enables the level of losses by coupling in the filament area to be controlled. However, the technique is costly and has a low yield.

The single stacking technique necessitates only two steps:

stage 0: manufacture of monofilament rods by extruding and drawing billets containing a superconductor alloy in a matrix, as in the previous technique;

stage 1: assembling monofilament rods, the number of which is equal to the number of filaments in stage 2 referred to above, in a matrix tube (Cu in this example).

The superconductor is then subjected to the usual processes, as in the previous technique.

The single stacking technique is less costly and has a higher yield than the double stacking technique but the absence of matrix channels between bundles of filaments limits the heat stability of the conductor and the possibility of controlling losses by coupling, as obtained with the double stacking technique.

Figure 2:
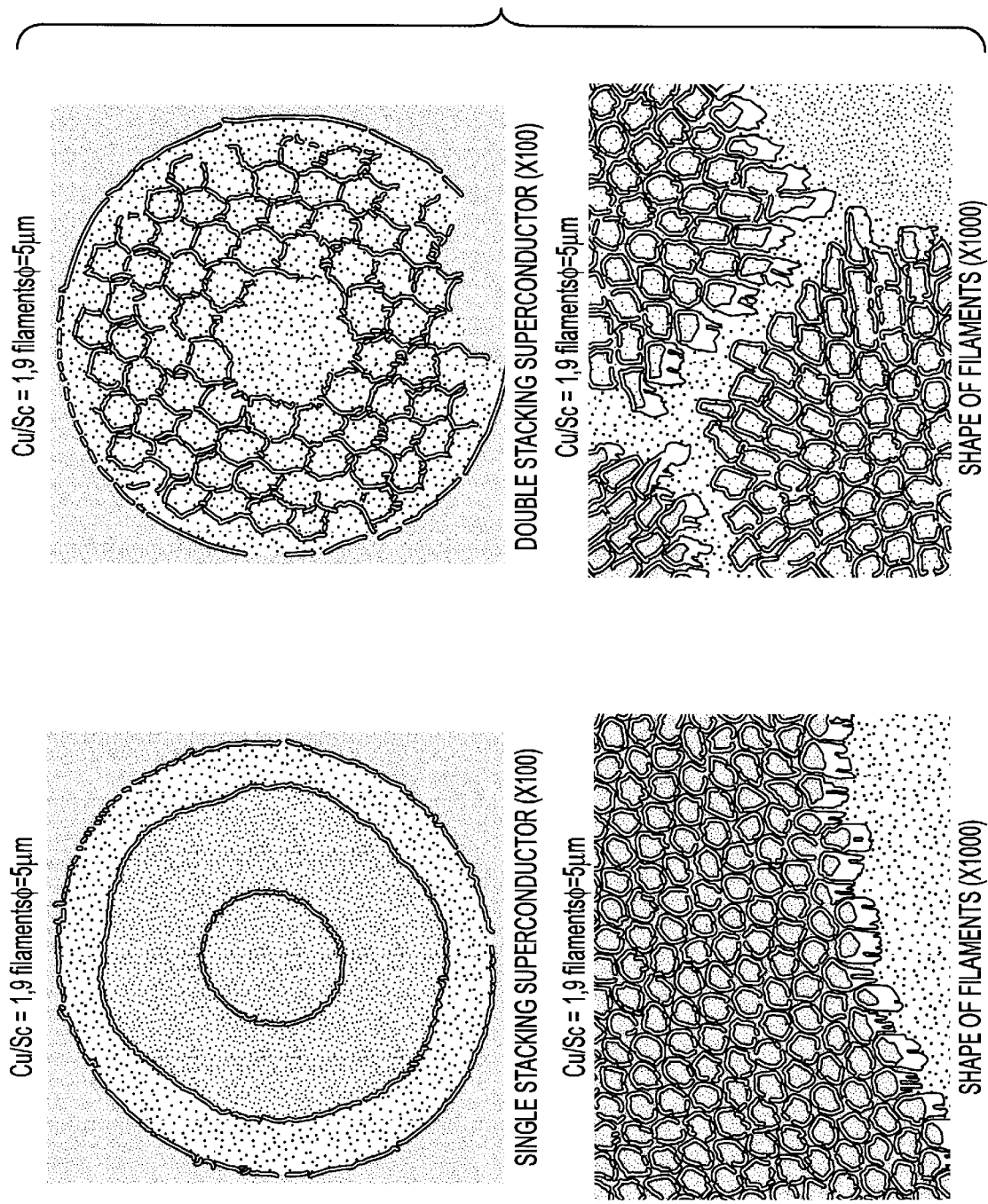

FIG. 2 of the accompanying drawings shows the cross-sections of a single stacking superconductor and a double stacking superconductor each with ×100 and ×1000 magnifications. The superconductors are intended to be used in the manufacture of the conductive inner layer of a bipolar magnet of a particle accelerator. In these superconductors the matrix (Cu)/superconductor (Sc) ratio is 1.9.

The figure enables a comparison of the two techniques described hereinabove. It shows in particular (×1000 magnification) the existence of Cu channels in the double stacking superconductor and their absence in the single stacking superconductor.

The aim of the invention is to provide a method of manufacturing a multifilament superconductor having improved heat stability and enabling the level of losses by coupling to be controlled, as compared to a superconductor manufactured by the single stacking technique, with reduced costs and increased yield compared to the double stacking technique.

In accordance with the invention, the above aim is achieved by a single stacking process that produces a superconductor having a cross-section similar to that of a superconductor obtained by the double stacking technique.

SUMMARY OF THE INVENTION

To be more precise, the invention consists in a method of manufacturing a stable multifilament multiconductor with reduced losses including making a billet by the single stacking technique and disposing conductive matrix rods and/or resistive matrix rods in the superconductor filament area of the billet to form matrix channels between bundles of superconductor filaments.

The superconductor filament area essentially comprises rods based on at least one superconductor alloy, in particular an alloy of niobium (Nb) such as NbTi and $Nb_3Sn$, for example.

The conductive matrix rods are advantageously of copper and the resistive matrix rods are advantageously of cupronickel.

The rods can have sections of various shapes. However, they preferably have a polygonal section, in particular a square, rectangular or preferably hexagonal section.

The rods are advantageously assembled to form the billet using the method described in patent FR 91 00795 (2 672 150) the title of which translates as: "Method of assembling composite billets for manufacturing multifilament superconductors".

The nature, number and position of the interposed rods can vary considerably depending on the intended applications and the required characteristics.

The method of the invention therefore offers, in particular, the possibility of very fine control of the electrical and thermal resistances of the multifilament superconductor made in the above manner.

EXAMPLE

Using the method of the invention and the method described in patent FR 91 00795 and employing hexagonal rods for optimal filling, a superconductor was made for particle accelerators.

Figure 3:
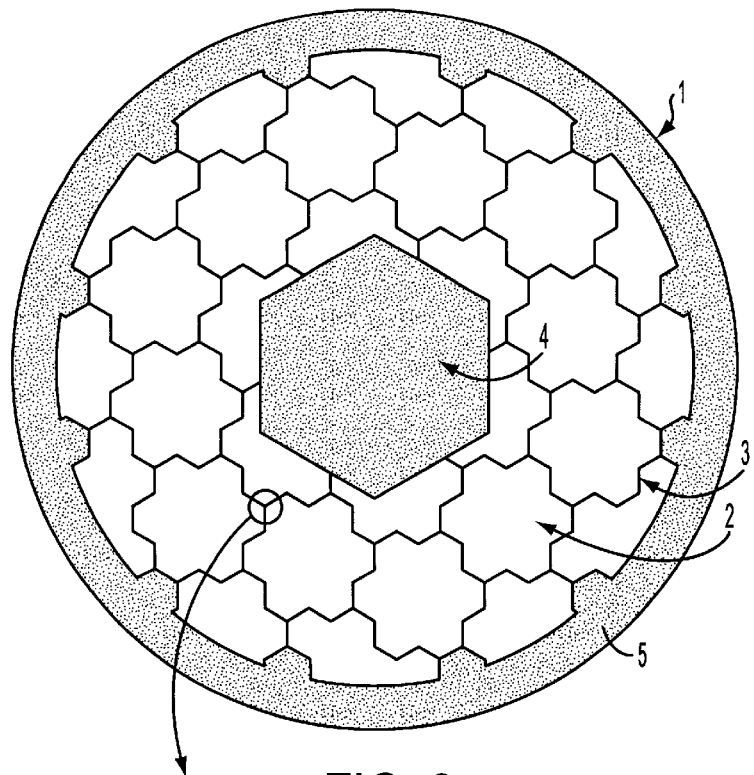

FIG. 3 of the accompanying drawings is a schematic representation in cross-section of the superconductor 1 which includes areas 2 made up of superconductor filaments surrounded by copper or a copper alloy, bundles of filaments being themselves surrounded by a copper or copper alloy inside wall 3, and a central rod 4 and an outside jacket 5 both of copper or copper alloy.

Figure 4:
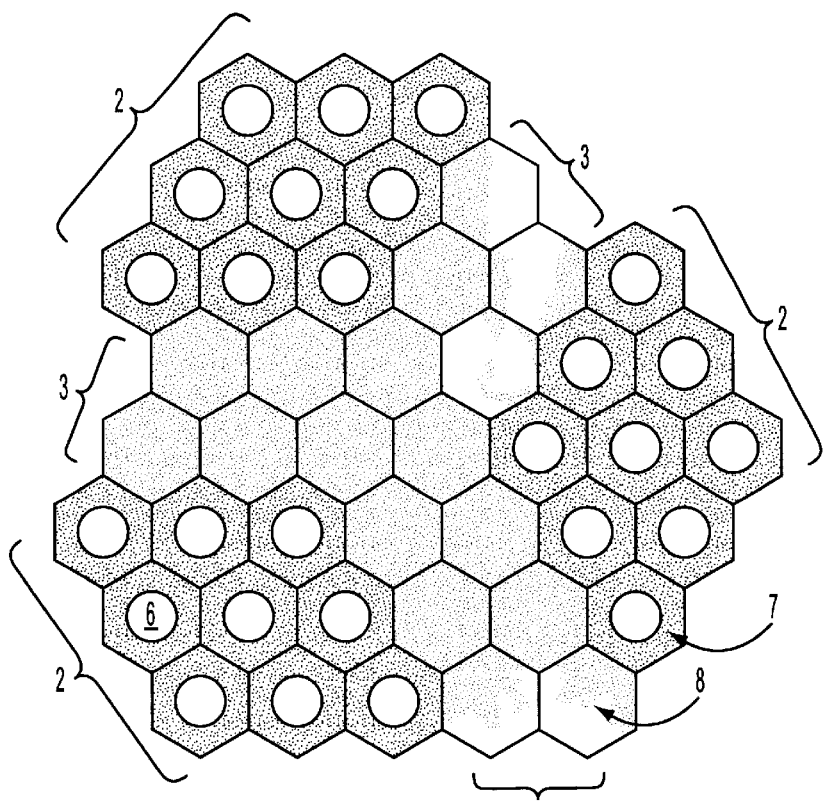

FIG. 4 of the accompanying drawings represents schematically a detail of the surroundings of a part of the inside wall of the superconductor from FIG. 3. It shows superconductor elements 6 buried in a copper or copper alloy matrix 7, 8.

There is claimed:

1. A method of manufacturing a stable multifilament superconductor, comprising:
   (a) providing a container;
   (b) disposing superconductive filaments within said container, wherein said superconductive filaments are grouped together to form a plurality of packets of said superconductive filaments within said container; and
   (c) disposing matrix rods in said container, wherein said matrix rods surround said packets of said superconductive filaments to form matrix channels between said packets to isolate said packets from each other.

2. The method claimed in claim 1, wherein said superconductor filaments comprise rods containing niobium alloy.

3. The method claimed in claim 2, wherein said niobium alloy is NbTi or $Nb_3Sn$.

4. The method claimed in claim 1, wherein said matrix rods comprise conductive matrix rods.

5. The method claimed in claim 1, wherein said matrix rods comprise resistive matrix rods.

6. The method claimed in claim 1, wherein said matrix rods have a polygonal cross-section.

7. The method claimed in claim 4, wherein said conductive matrix rods comprise copper.

8. The method claimed in claim 5, wherein said resistive matrix rods comprise cupronickel.

9. The method claimed in claim 1, wherein said matrix rods comprise conductive matrix rods and resistive matrix rods.

10. The method claimed in claim 6, wherein said matrix rods have a rectangular cross-section.

11. The method claimed in claim 10, wherein said matrix rods have a square cross-section.

12. The method claimed in claim 6, wherein said matrix rods have a hexagonal cross-section.

13. The method claimed in claim 1, wherein each of said superconductive filaments are surrounded by a polygonal-shaped metal or polygonal-shaped metal alloy.

14. The method claimed in claim 13, wherein a cross-sectional shape of said polygonal-shaped metal or said polygonal-shaped metal alloy and a cross-sectional shape of said matrix rods are substantially the same.

15. A method of manufacturing a stable multifilament superconductor, comprising:
    (a) providing a container;
    (b) disposing superconductive elements within said container, wherein each of said superconductive elements comprises a suconductive filament surrounded by a polygonal-shaped metal or a polygonal-shaped metal alloy and wherein said superconductive elements are grouped together to form a plurality of bundles of said superconductive elements within said container; and
    (c) disposing matrix rods in said container, wherein said matrix rods surround said bundles of said superconductive elements to form matrix channels between said bundles to isolate said bundles from each other and wherein a cross-sectional shape of said matrix rods is substantially the same as a cross-sectional shape of said superconductive elements.

16. The method claimed in claim 15, wherein said superconductor filaments comprise niobium alloy, and
    wherein said polygonal-shaped metal or said polygonal-shaped metal alloy contain copper.

17. The method claimed in claim 15, wherein said cross-section shape of said matrix rods and said cross-sectional shape of said superconductive elements are rectangular.

18. The method claimed in claim 17, wherein said cross-section shape of said matrix rods and said cross-section shape of said superconductive elements are square.

19. The method claimed in claim 15, wherein said cross-section shape of said matrix rods and said cross-section shape of said superconductive elements are hexagonal.

* * * * *